(12) United States Patent
Eid et al.

(10) Patent No.: US 11,342,243 B2
(45) Date of Patent: May 24, 2022

(54) THERMAL MANAGEMENT SOLUTIONS FOR EMBEDDED INTEGRATED CIRCUIT DEVICES

(71) Applicant: Intel Corporation, Santa Clara, CA (US)

(72) Inventors: Feras Eid, Chandler, AZ (US); Adel Elsherbini, Chandler, AZ (US); Johanna Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 730 days.

(21) Appl. No.: 16/141,734

(22) Filed: Sep. 25, 2018

(65) Prior Publication Data

US 2020/0098668 A1 Mar. 26, 2020

(51) Int. Cl.
*H01L 23/473* (2006.01)
*H01L 23/538* (2006.01)
*H01L 23/427* (2006.01)
*H01L 21/48* (2006.01)
*H01L 23/22* (2006.01)

(52) U.S. Cl.
CPC .......... *H01L 23/473* (2013.01); *H01L 21/486* (2013.01); *H01L 21/4857* (2013.01); *H01L 21/4871* (2013.01); *H01L 23/22* (2013.01); *H01L 23/427* (2013.01); *H01L 23/5383* (2013.01); *H01L 23/5386* (2013.01); *H01L 23/5389* (2013.01)

(58) Field of Classification Search
CPC .......... H01L 23/46–4735; H01L 23/22; H01L 23/427; H01L 21/4857; H01L 21/486; H01L 23/5383; H01L 23/5386; H01L 23/5389; H01L 23/34–4735; H01L 21/4871–4882

See application file for complete search history.

(56) References Cited

U.S. PATENT DOCUMENTS

2017/0271266 A1* 9/2017 Kim .................... H01L 23/5383
2018/0226310 A1* 8/2018 Eid .......................... H01L 23/12

* cited by examiner

*Primary Examiner* — Selim U Ahmed
*Assistant Examiner* — Evan G Clinton
(74) *Attorney, Agent, or Firm* — Essential Patents Group, LLP.

(57) ABSTRACT

An integrated circuit structure may be formed having a substrate, at least one integrated circuit device embedded in and electrically attached to the substrate, and a heat transfer fluid conduit extending through the substrate. In one embodiment, the heat transfer fluid conduit may be lined with a metallization within the substrate. In a further embodiment, the heat transfer fluid conduit may comprise multiple fluid channels for the removal of heat from multiple surfaces of the at least one integrated circuit device. In still a further embodiment, the substrate may include a molded layer, wherein at least one fluid channel is formed in the molded layer.

18 Claims, 5 Drawing Sheets

THERMAL MANAGEMENT SOLUTIONS FOR EMBEDDED INTEGRATED CIRCUIT DEVICES

TECHNICAL FIELD

Embodiments of the present description generally relate to the removal of heat from integrated circuit devices, and, more particularly, to thermal management solutions for integrated circuit devices that are embedded in substrates.

BACKGROUND

Higher performance, lower cost, increased miniaturization, and greater packaging density of integrated circuits within integrated circuit devices are ongoing goals of the electronics industry. As these goals are achieved, the integrated circuit devices become smaller. Accordingly, the density of power consumption of electronic components within the integrated circuit devices has increased, which, in turn, increases the average junction temperature of the integrated circuit device. If the temperature of the integrated circuit device becomes too high, the integrated circuits may be damaged or destroyed. This issue becomes even more critical when integrated circuit devices are embedded in the substrate to which they are electrically connected in the formation of an integrated circuit package.

Integrated circuit packages with substrate-integrated devices, such as bumpless build-up layer packages or fan-out packages, are options for decreasing the thickness or Z-height of the integrated circuit package. Instead of a traditional flip chip package wherein the integrated circuit devices are assembled on a surface of a substrate using interconnects, such as solder bumps or balls, the integrated circuit devices are embedded inside the substrate or mold layer, and/or at least some of the package redistribution layers are formed directly over the integrated circuit device (e.g. at the wafer level, the reconstituted wafer level, or the panel level). Such integrated circuit packages with substrate-integrated devices can allow for thinner form factors and better system-in-package (SiP) integration compared to their traditional flip-chip package counterparts.

As will be understood to those skilled in the art, when the integrated circuit device is embedded in the substrate, there is no exposed surface of the integrated circuit device to attach a heat dissipation device, such as a heat spreader and/or an active cooling solution. Thus, the internally positioned integrated circuit device may exceed its temperature limit and be damaged or destroyed, leading to the failure of the entire integrated circuit package.

One option to mitigate this thermal issue is to use integrated circuit devices having thermal throttling control that are capable of reducing their operating frequency and, thus, their power in order to operate at a lower temperature and avoid failures. However, this results in a lower overall performance.

Another option to mitigate thermal issues is to use low-power integrated circuit devices in the substrate that do not require heat dissipation. However, higher power integrated circuit devices are excluded and may have to be attached to the substrate in the traditional manner, leading to increased thickness of the integrated circuit package.

A further option is to use metal layers within the substrate for heat dissipation. However, this is generally not sufficiently efficient due to the thinness of the metal layers compared to a traditional heat dissipation device.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
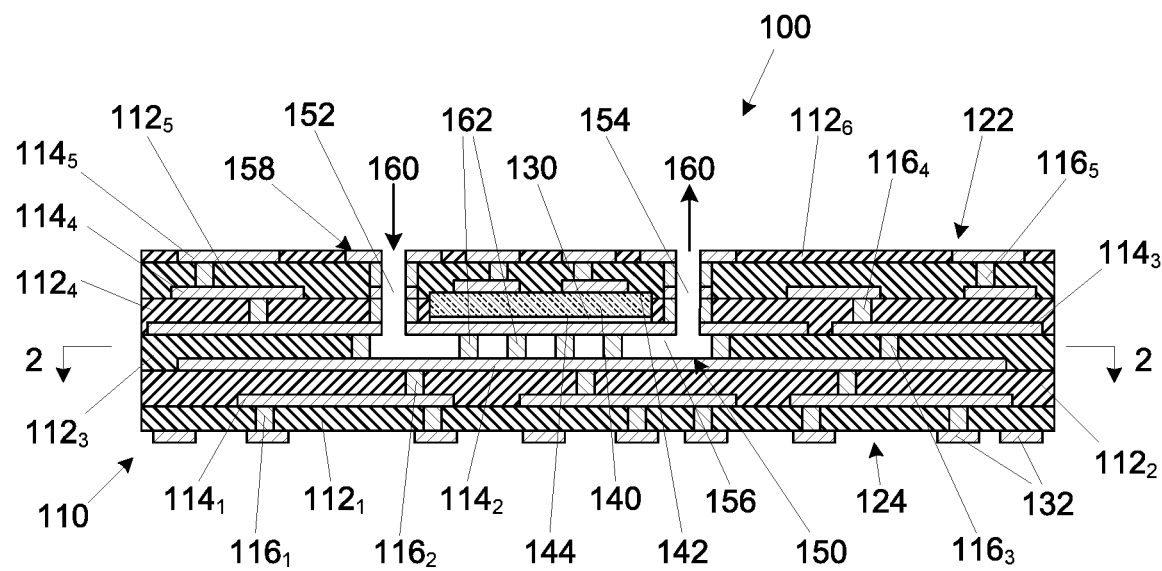
FIG. 1 is a side cross-sectional view of an integrated circuit structure having an integrated circuit device embedded in a substrate, wherein a heat transfer fluid conduit is formed in the substrate, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention.

Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit devices and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures. as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description may include an integrated circuit structure having a substrate, at least one integrated circuit device embedded in and electrically attached to the substrate, and a heat transfer fluid conduit extending through the substrate. In one embodiment, the heat transfer fluid conduit may be lined with a metallization within the substrate. In a further embodiment, the heat transfer fluid conduit may comprise multiple fluid channels for the removal of heat from multiple surfaces of the at least one integrated circuit device. In still a further embodiment, the substrate may include a molded layer, wherein at least one fluid channel is formed in the molded layer.

FIG. 1 illustrates an integrated circuit package 100 having an integrated circuit device 140 embedded in a substrate 110, according to an embodiment of the present description. As shown in FIG. 1, the substrate 110 may be formed with a plurality of dielectric material layers $112_1$-$112_6$ and a plurality of conductive routes, such as conductive traces $114_1$-$114_5$ formed in or on the dielectric material layers $112_1$-$112_6$, respectively, which are connected with conductive vias $116_1$-$116_5$. These conduction routes may be referred to herein as "metallization". The substrate 110 may further include a plurality of bond pads 132 in or on a second surface 124 of the substrate 110, wherein the bond pads 132 may be in electrical contact with the metallization, i.e. through the conductive vias $116_1$ to the conductive traces $114_1$. As will be understood to those skilled in the art, the bond pads 132 may be used to form interconnects (not shown) thereon, such as solder balls, to connect the integrated circuit package 100 to external components (not shown), such as a motherboard.

The substrate 110 may be any appropriate structure, including, but not limited to, an interposer, a printed circuit board, a motherboard, and the like. The dielectric material layers $112_1$-$112_6$ of the substrate 110 may include build-up films and/or solder resist layers, and may be composed of an appropriate dielectric material, including, but not limited to, bismaleimide triazine resin, fire retardant grade 4 material, polyimide materials, glass reinforced epoxy matrix material, silica filled epoxy, and the like, as well as laminates or multiple layers thereof. The metallization, e.g. the conductive traces $114_1$-$114_5$ and the conductive vias $116_1$-$116_5$ may be composed of any conductive material, including but not limited to metals, such as copper, aluminum, and alloys thereof. As will be understood to those skilled in the art, the substrate 110 may be either a cored or a coreless substrate.

In one embodiment, the integrated circuit device 140 may be embedded in the substrate 110 during the fabrication thereof, such that a first surface 142 of the integrated circuit device 140 is directly electrically attached to the metallization (shown as being attached to conductive traces $114_4$) in the substrate 110. In an embodiment, a second surface 144 (opposite the first surface 142) of the integrated circuit device 140 is attached to the metallization (shown as being attached to conductive traces $114_3$) in the substrate, such as with an adhesive material 130. In one embodiment, the adhesive material 130 may be a thermally conductive adhesive material, including but not limited to metal-filled epoxies. The integrated circuit device 140 may be any appropriate device, including, but not limited to a microprocessor, a chipset, a graphics device, a wireless device, a memory device, an application specific integrated circuit, combinations thereof, stacks thereof, or the like. The processes for layering the dielectric material layers $112_1$-$112_6$ and for the attachment of the integrated circuit device 140 to the metallization are well known in the art and for purposes of brevity and conciseness will not be described herein. For the purposes of the present description, the term "embedded" is defined to mean that the integrated circuit device 140 is positioned between a first surface 122 of the substrate 110 and the second surface 124 of the substrate 110.

As shown in FIG. 1, the integrated circuit package 100 may include a heat transfer fluid conduit 150, which may comprise at least one inlet port 152, at least one outlet port 154, and at least one fluid channel 156 connecting the at least one inlet port 152 and the at least one outlet port 154. A heat transfer fluid 160 (illustrated generically as a down arrow (left side) and an up arrow (right side)), which may be used to remove heat from the substrate 110, may flow into the at least one fluid channel 156 through the at least one inlet port 152 and out of the fluid channel 156 through the at least one outlet port 154. In one embodiment, the metallization of the substrate 110 may be used to create a liner 158 for the heat transfer fluid conduit 150. Thus, the heat transfer fluid 160 may be entirely isolated from materials, such as the dielectric material layers $112_1$-$112_6$ of the substrate 110, which may be porous and adversely affected by contact with the heat transfer fluid 160. The heat transfer fluid 160 may be any appropriate gas or liquid, or a combination thereof. In one embodiment, the heat transfer fluid 160 may comprise water. In another embodiment, the heat transfer fluid 160 may comprise a dielectric refrigerant. In a further embodiment, the heat transfer fluid 160 may comprise an oil. In other embodiments, the heat transfer fluid 160 may be comprised of two phases (such as liquid water and water vapor, or liquid-phase and gas-phase dielectric refrigerant) that exist simultaneously in one or more regions of the heat transfer fluid conduit 150.

In the embodiment shown in FIG. 1, the integrated circuit device 140 only has electrical connection on the first surface 142 thereof which leaves the second surface 144 of the integrated circuit device 140 available for heat removal. Thus, the second surface 144 of the integrated circuit device 140 may be thermally attached to the metallization that forms the liner 158 for the heat transfer fluid conduit 150 (shown attached to conductive trace layer $114_3$). In another embodiment, the metallization may also be used for forming thermally conductive structures 162, such as pillars, columns, pins, walls, or the like, to extend through the fluid channel 156 to improve heat removal by the heat transfer fluid 160.

Figure 2:
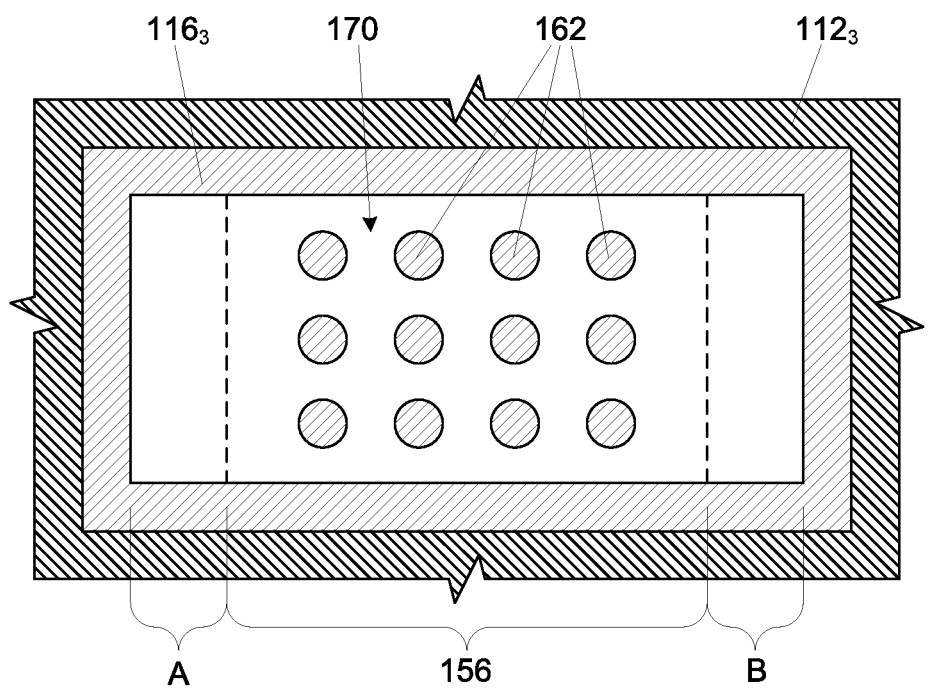
FIG. 2 is a partial cross-sectional view of a fluid channel of the heat transfer fluid conduit along line 2-2 of FIG. 1, according to one embodiment of the present description.
Figure 3:
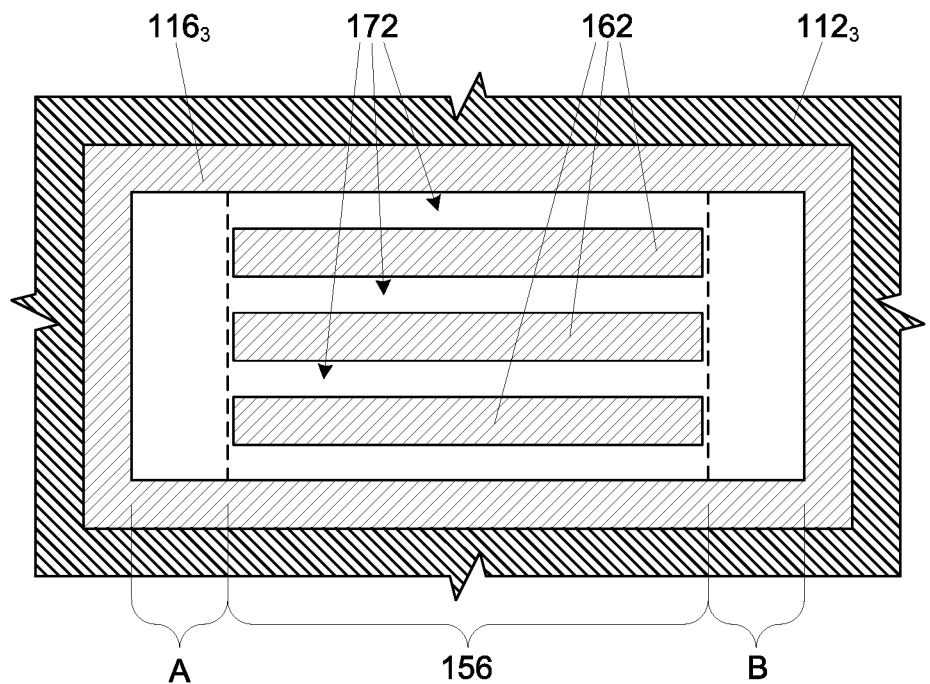
FIGS. 3 and 4 are alternate configurations of the fluid channel of the heat transfer fluid conduit of FIG. 2, according to an embodiment of the present description.
Figure 4:
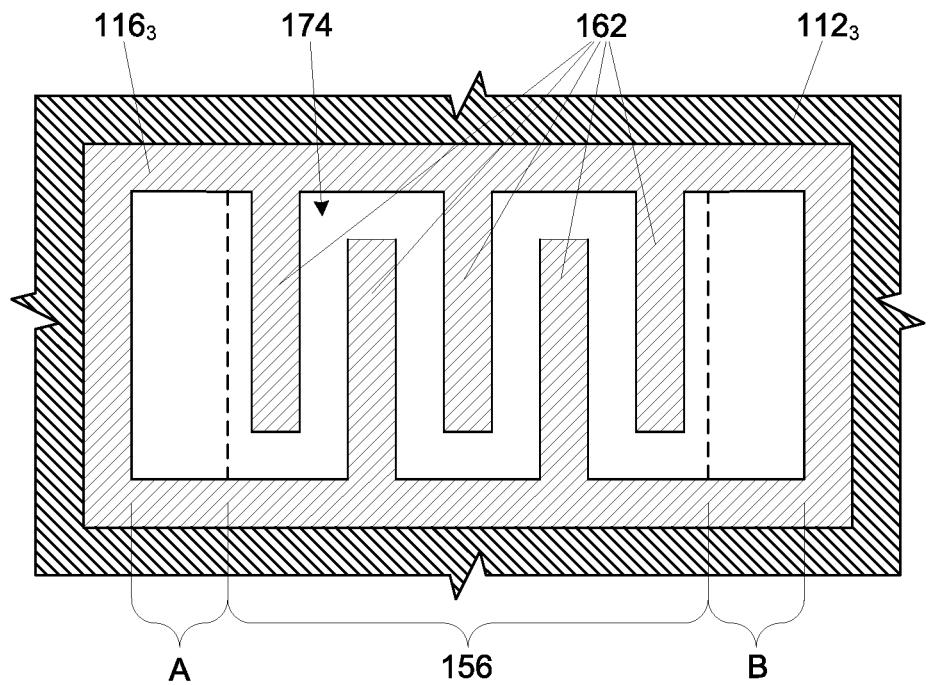

The fluid channel 156 may have any appropriate configuration. In one embodiment shown in FIG. 2, which is a view along line 2-2 of FIG. 1, the fluid channel 156 may be a single chamber 170 with a plurality of columnar-shaped, thermally conductive structures 162 disposed therein. As shown, the fluid channel 156 extends between an inlet port zone A (e.g. the area where the inlet port 152 (see FIG. 1) introduces the heat transfer fluid 160 (see FIG. 1)) to the fluid chamber 170 and an outlet port zone B (e.g. the area where the inlet port 152 (see FIG. 1) provides a removal route for the heat transfer fluid 160 (see FIG. 1) from the fluid chamber 170). In another embodiment shown in FIG. 3, the thermally conductive structures 162 may be wall-shaped structures that are aligned in parallel, such that the fluid channel 156 comprises a plurality of discrete channels 172. In a further embodiment, the thermally conductive structures 162 may be wall-shaped structures that are aligned to form a single circuitous channel 174 traveling a serpentine route from the inlet port zone A to the outlet port zone B, as shown in FIG. 4.

Figure 5:
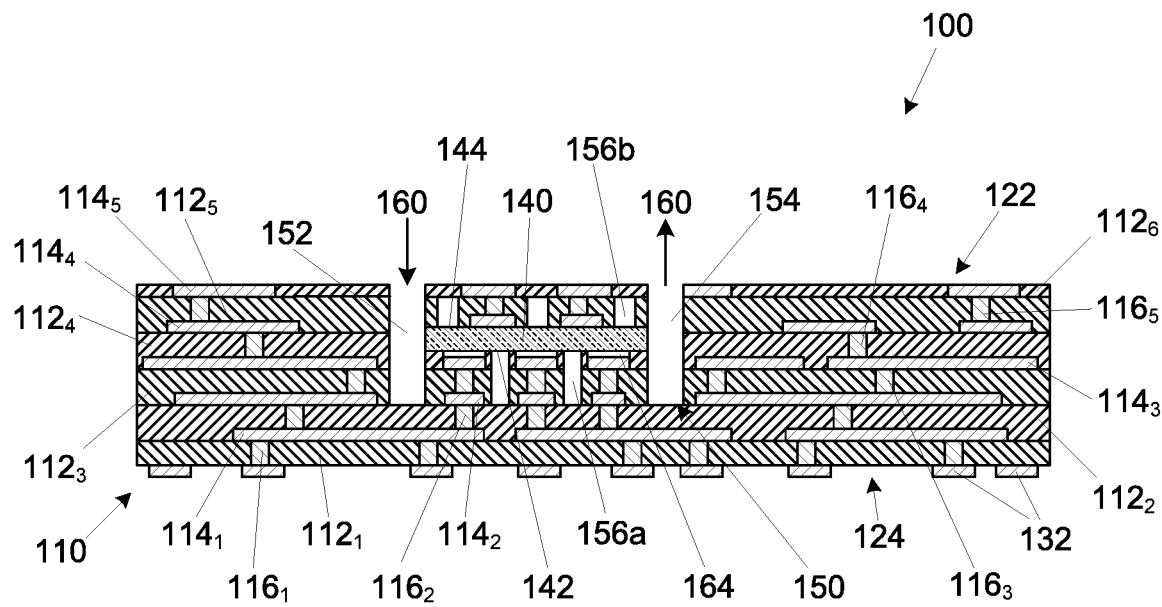
FIG. 5 is a side cross-sectional view of an integrated circuit structure having an integrated circuit device embedded in a substrate, wherein a heat transfer fluid conduit is formed in the substrate and wherein the heat transfer fluid conduit is configured to remove heat from two surfaces of the embedded integrated circuit device, according to an embodiment of the present description.

FIG. 5 illustrates an embodiment of the present description, wherein the dielectric material layers $112_1$-$112_6$ comprise liquid impermeable dielectric material. As the dielectric material layers $112_1$-$112_6$ will be impermeable to the heat transfer fluid 160, the liner 158 of FIG. 1 is not used. The dielectric material layers $112_1$-$112_6$ may comprise any appropriate liquid impermeable dielectric material, including, but not limited to, a liquid crystal polymer (LCP), a benzocyclobutene-based polymer. In one embodiment, the dielectric material layers $112_1$-$112_6$ may be photo-imagable dielectrics. As shown in FIG. 5, liquid impermeable dielectric material layers $112_1$-$112_6$ may isolate the metallization (e.g. the conductive traces $114_1$-$114_5$ and the dielectric material layers $116_1$-$116_6$) from the heat transfer fluid 160.

As shown in FIG. 5, the integrated circuit device 140 may be electrically connected to the metallization within the substrate 110 at the first surface 142 (illustrated as connected to trace layer $114_3$) of the integrated circuit device 140 and at the second surface 144 (illustrated as connected to trace layer $114_4$) of the integrated circuit device 140. In one embodiment, the connection to the metallization at either the first surface 142 or the second surface 144 may be achieved with bond pads (not shown) thereon, which are in electrical communication with integrated circuitry (not shown) within the integrated circuit device 140. In another embodiment, the connection to the metallization at either the first surface 142 or the second surface 144 may be achieved with through-silicon vias (not shown) thereon, which are in electrical communication with integrated circuitry (not shown) within the integrated circuit device 140. In a further embodiment, the electrical connection to the metallization at one of the first surface 142 may include an intermediate layer 164, such as an electrically conductive adhesive, including, but not limited to metal filled epoxies, or such as a solder connection, including, but not limited to, tin, lead/tin alloys, such as 63% tin/37% lead solder, and high tin content alloys (e.g. 90% or more tin), such as tin/bismuth, eutectic tin/silver, ternary tin/silver/copper, eutectic tin/copper, and similar alloys.

As further shown in FIG. 5, the heat transfer fluid conduit 150 may comprise two fluid channels, a first fluid channel 156a proximate the first surface 142 of the integrated circuit device 140 and a second fluid channel 156b proximate the second surface 144 of the integrated circuit device 140. As still further shown in FIG. 5, in one embodiment, a portion of the first surface 142 of the integrated circuit device 140 may be exposed within the at least one first fluid channel 156a. As the heat transfer fluid 160 passes through the heat transfer fluid conduit 150, it will contact the first surface 142 of the integrated circuit device 140 so as to remove heat directly therefrom. As also shown in FIG. 5, in an embodiment, a portion of the second surface 144 of the integrated circuit device 140 may be exposed within the at least one second fluid channel 156b. As the heat transfer fluid 160 passes through the heat transfer fluid conduit 150, it will contact the second surface 144 of the integrated circuit device 140 so as to remove heat directly therefrom.

Figure 6:
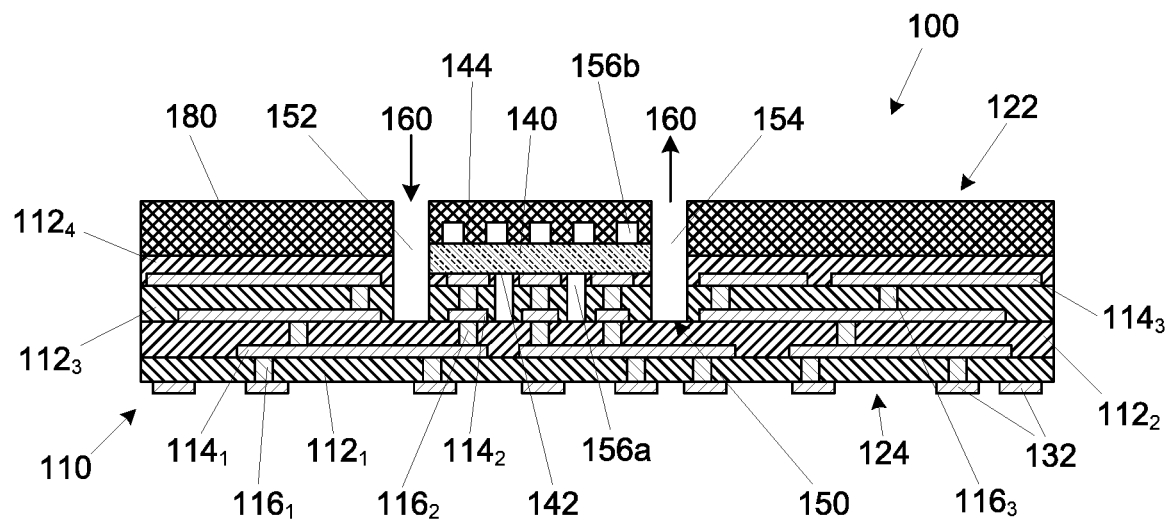
FIG. 6 is a side cross-sectional view of an integrated circuit structure having an integrated circuit device embedded in a substrate, wherein a heat transfer fluid conduit is formed in the substrate, wherein the substrate includes a molded layer, and wherein at least a portion of the heat transfer fluid conduit is formed in the molded layer, according to an embodiment of the present description.

FIG. 6 illustrates an embodiment of the present description, wherein the substrate 110 may include a molded layer 180. In the embodiment illustrated in FIG. 6, the molded layer 180 abuts dielectric material layer $112_4$ and the second surface 144 of the integrated circuit device 140. The at least one second fluid channel 156b may be formed in the molded layer 180. If the material used for the mold layer 180 is porous or otherwise incompatible with the heat transfer fluid 160, a sealant or coating layer (not shown) may be patterned within the at least one second fluid channel 156b to abut the molded layer 180. As shown, the molded layer 180 may form a portion of the inlet port 152 and the outlet port 154. The molded layer 180 may be any appropriate material, including, but not limited to an epoxy material.

Although the detailed description illustrates a single integrated circuit device 140 and a single fluid channel 156 or two fluid channels 156a, 156b, it is understood that various embodiments may include any number of integrated circuit devices and fluid channels.

Figure 7:
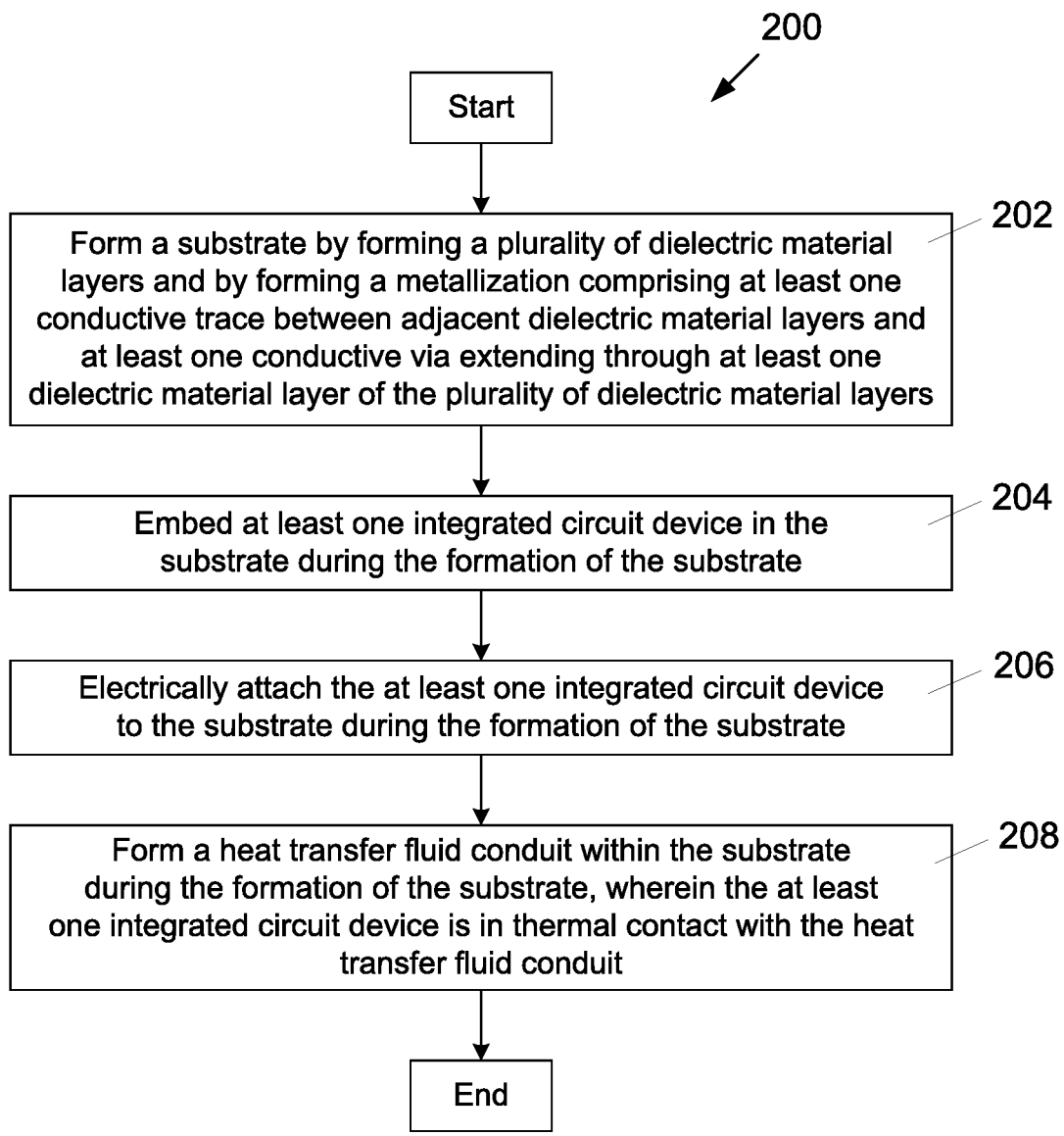
FIG. 7 is a flow diagram of a method of fabricating an integrated circuit structure, according to one embodiment of the present description.

FIG. 7 is a flow chart of a process 200 of fabricating an integrated circuit structure according to an embodiment of the present description. As set forth in block 202, a substrate may be formed by forming a plurality of dielectric material layers and by forming a metallization comprising at least one conductive trace between adjacent dielectric material layers and at least one conductive via extending through at least one dielectric material layer of the plurality of dielectric material layers. An integrated circuit device may be embedded in the substrate during the formation of the substrate, as set forth in block 204. As set forth in block 206, the integrated circuit device may be electrically attached to the substrate during the formation of the substrate. A heat transfer fluid conduit may be formed within the substrate during the formation of the substrate, wherein the at least one integrated circuit device is in thermal contact with the fluid conduit, as set forth in block 208.

Figure 8:
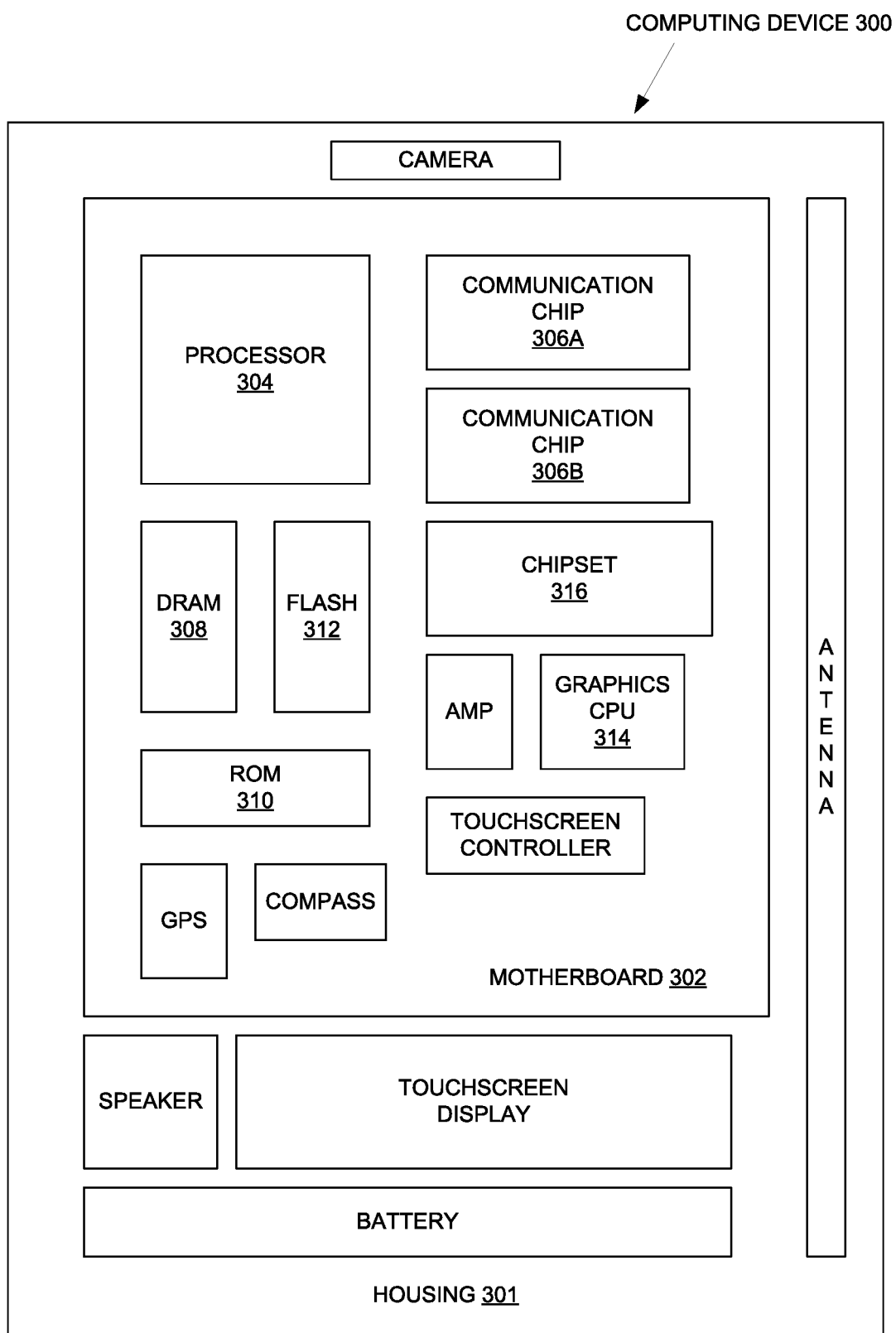
FIG. 8 is an electronic device/system, according to an embodiment of the present description.

FIG. 8 illustrates an electronic or computing device 300 in accordance with one implementation of the present description. The computing device 300 may include a housing 301 having a board 302 disposed therein. The board 302 may include a number of integrated circuit components, including but not limited to a processor 304, at least one communication chip 306A, 306B, volatile memory 308 (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 302. In some implementations, at least one of the integrated circuit components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit structure comprising a substrate, at least one integrated circuit device embedded in and electrically attached to the substrate; and a heat transfer fluid conduit extending though the substrate, wherein the heat transfer fluid conduit is in thermal contact with the at least one integrated circuit device.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-8. The subject matter may be applied to other integrated circuit devices and assembly applications, as well as any appropriate electronic application, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An integrated circuit assembly, comprising:
    a substrate, wherein the substrate comprises a plurality of dielectric layers and metallization comprising at least one conductive trace between adjacent dielectric layers and at least one conductive via extending through at least one dielectric layer of the plurality of dielectric layers, and wherein the plurality of dielectric layers each comprises a liquid impermeable dielectric material;
    at least one integrated circuit device embedded in and electrically attached to the substrate; and
    a heat transfer fluid conduit within the substrate, wherein the heat transfer fluid conduit is in thermal contact with the at least one integrated circuit device.

2. The integrated circuit assembly of claim 1, wherein the heat transfer fluid conduit includes a liner formed from metallization within the substrate.

3. The integrated circuit assembly of claim 1, wherein the substrate includes at least one mold layer.

4. The integrated circuit assembly of claim 3, wherein at least a portion of the heat transfer fluid conduit extends through the at least one mold layer.

5. The integrated circuit assembly of claim 1, wherein the heat transfer fluid conduit comprises an inlet port, an outlet port, and at least one fluid channel extending between the inlet port and the outlet port.

6. The integrated circuit assembly of claim 1, wherein the at least one fluid channel comprises a first fluid channel proximate a first surface of the integrated circuit device and a second fluid channel proximate a second surface of the integrated circuit device.

7. A method of fabricating an integrated circuit assembly, comprising:
    forming a substrate, wherein the substrate comprises a plurality of dielectric layers and metallization comprising at least one conductive trace between adjacent dielectric layers and at least one conductive via extending through at least one dielectric layer of the plurality of dielectric layers, and wherein the plurality of dielectric layers comprises a liquid impermeable dielectric material;
    embedding an integrated circuit device in the substrate;
    electrically attaching the integrated circuit device to the substrate; and
    forming a heat transfer fluid conduit within the substrate during the formation of the substrate, wherein the at least one integrated circuit device is in thermal contact with the heat transfer fluid conduit.

8. The method of claim 7, further comprising forming a liner for the heat transfer fluid conduit from metallization within the substrate.

9. The method of claim 7, wherein forming the substrate includes at least one mold layer.

10. The method of claim 9, further comprising forming at least a portion of the heat transfer fluid conduit to extend through the at least one mold layer.

11. The method of claim 7, wherein the heat transfer fluid conduit comprises an inlet port, an outlet port, and at least one fluid channel extending between the inlet port and the outlet port.

12. The method of claim 7, wherein the at least one fluid channel comprises a first fluid channel proximate a first surface of the integrated circuit device and a second fluid channel proximate the second surface of the integrated circuit device.

13. An electronic system, comprising:
    a board;
    an integrated circuit package electrically attached to the board, wherein the integrated circuit package comprises a substrate, wherein the substrate comprises a plurality of dielectric layers and metallization comprising at least one conductive trace between adjacent dielectric layers and at least one conductive via extending through at least one dielectric layer of the plurality of dielectric layers, and wherein the plurality of dielectric layers each comprises a liquid impermeable dielectric material, at least one integrated circuit device embedded in and electrically attached to the substrate, and a heat transfer fluid conduit within the substrate, wherein the heat transfer fluid conduit is in thermal contact with the at least one integrated circuit device.

14. The electronic system of claim 13, wherein the heat transfer fluid conduit includes a liner formed from metallization within the substrate.

15. The electronic system of claim 13, wherein the substrate includes at least one mold layer.

16. The electronic system of claim 15, wherein at least a portion of the heat transfer fluid conduit extends through the at least one mold layer.

17. The electronic system of claim 13, wherein the heat transfer fluid conduit comprises an inlet port, an outlet port, and at least one fluid channel extending between the inlet port and the outlet port.

18. The electronic system of claim 13, wherein the at least one fluid channel comprises a first fluid channel proximate a first surface of the integrated circuit device and a second fluid channel proximate second surface of the integrated circuit device.

\* \* \* \* \*